(12) United States Patent
Chen et al.

(10) Patent No.: US 9,508,813 B1
(45) Date of Patent: Nov. 29, 2016

(54) HIGH-SIDE FIELD EFFECT TRANSISTOR

(71) Applicant: UNITED MICROELECTRONICS CORPORATION, Hsinchu (TW)

(72) Inventors: Yen-Ming Chen, New Taipei (TW); Chiuling Lee, Hsinchu (TW); Min-Hsuan Tsai, Tainan (TW); Zheng Hong Chen, Taoyuan (TW); Wei Hsuan Chang, Tainan (TW); Tseng-Hsun Liu, Taipei (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/706,002

(22) Filed: May 7, 2015

(51) Int. Cl.
*H01L 29/423* (2006.01)
*H01L 29/78* (2006.01)
*H01L 29/66* (2006.01)

(52) U.S. Cl.
CPC ..... *H01L 29/42364* (2013.01); *H01L 29/4238* (2013.01); *H01L 29/66795* (2013.01); *H01L 29/785* (2013.01)

(58) Field of Classification Search
CPC ........... H01L 29/66795; H01L 29/785; H01L 29/4238; H01L 27/0207; H01L 29/0696
USPC ....................................................... 257/401
See application file for complete search history.

(56) References Cited

U.S. PATENT DOCUMENTS

| | | | |
|---|---|---|---|
| 6,046,474 A | 4/2000 | Oh | |
| 7,560,774 B1* | 7/2009 | Liu | H01L 21/823418 257/288 |
| 2008/0088283 A1* | 4/2008 | Ruobiao | H02M 3/1588 323/271 |
| 2012/0286359 A1* | 11/2012 | Lin | H01L 29/1045 257/335 |
| 2014/0306293 A1* | 10/2014 | Baek | H01L 27/088 257/394 |

* cited by examiner

*Primary Examiner* — Walter H Swanson
(74) *Attorney, Agent, or Firm* — Ding Yu Tan

(57) ABSTRACT

The present invention provides a transistor comprising a substrate having a surface; a first deep well region in the substrate; a second deep well region in the substrate, isolated from and encircling the first deep well region; a first well region in the substrate and on the first deep well region; two second well regions in the second deep well region and respectively at two opposite sides of the first well region; a source region in the first well region and adjacent to the surface; two drain regions in the two second well regions respectively and adjacent to the surface; two gate structures on the surface, wherein each of the two gate structures is between the source region and one of the drain regions respectively; and a guard ring in the substrate encircling the second deep well region, and on the periphery of the transistor.

15 Claims, 6 Drawing Sheets

HIGH-SIDE FIELD EFFECT TRANSISTOR

FIELD OF THE INVENTION

The present invention is related to a high-side field effect transistor, especially a high-side field effect transistor with improved high-side ability.

BACKGROUND OF THE INVENTION

In the high-side switching configuration, the power switch is located between the load and the positive terminal of the battery and controls energy flow by opening or closing the power supply path. The high-side switching configuration offers a unique advantage of protecting against inadvertent load short events in which the load may be short-circuited to ground (i.e., vehicle chassis). Because the power switch is located upstream, a load short does not cause a catastrophic battery short as in the case of the low-side switching configuration.

However, the inventor has found out that, in a conventional high-side metal-oxide-semiconductor field effect transistor (MOSFET), voltage tolerance of the substrate is limited by its structure, and thus performance of a high-side switching configuration is limited. Moreover, a conventional high-side MOSFET has a problem of electric field punching through, and it results in actual performance worse than theoretical yield. With market trend of minimization and demands of high performance at the same time, performance of high-side switching configuration has to be improved.

Accordingly, it is needed to provide a new structure of high-side MOSFET in order to solve the problem of electric field punching through in a conventional high-side switching configuration and also improve voltage tolerance and high-side ability.

SUMMARY OF THE INVENTION

In accordance with an aspect, the present invention provides a high-side field effect transistor, which comprises a substrate having a surface; a first deep well region disposed in the substrate; a second deep well region disposed in the substrate, isolated from and encircling the first deep well region; a first well region disposed in the substrate and on the first deep well region; two second well regions disposed in the second deep well region and respectively at two opposite sides of the first well region; a source region disposed in the first well region and adjacent to the surface of the substrate; two drain regions disposed in the two second well regions respectively and adjacent to the surface of the substrate; two gate structures disposed on the surface of the substrate, wherein each of the two gate structures is disposed between the source region and one of the drain regions respectively; and a guard ring disposed in the substrate encircling the second deep well region, and on the periphery of the high-side field effect transistor.

In one embodiment of the present invention, the source region comprises a source contact region with a conductive type different from a conductive type of the source region.

In one embodiment of the present invention, the first and second deep well regions have the same conductive type.

In one embodiment of the present invention, the first and second well regions have different conductive types.

In one embodiment of the present invention, the high-side field effect transistor further comprises a plurality of isolations disposed between the gate structure and the drain region and between the drain region and the guard ring.

In one embodiment of the present invention, a doping concentration of the first well region is higher than a doping concentration of the first deep well region.

In one embodiment of the present invention, a doping concentration of the second well region is higher than a doping concentration of the second deep well region.

In one embodiment of the present invention, a doping concentration of the source region is higher than a doping concentration of the first well region.

In one embodiment of the present invention, a doping concentration of the drain regions is higher than a doping concentration of the second well region.

In one embodiment of the present invention, a width of the first well region is larger than a width of the first deep well region.

In one embodiment of the present invention, a width of the second well region is smaller than a width of the second deep well region.

In one embodiment of the present invention, the guard ring comprises a guard ring region having a same conductive type as the first well region; and a guard ring contact region disposed adjacent to the surface of the substrate.

In one embodiment of the present invention, the substrate has a different conductive type from a conductive type of the first and second deep well regions.

In one embodiment of the present invention, the conductive type of the substrate is P type.

In one embodiment of the present invention, the conductive type of the first and second deep well regions is N type.

In one embodiment of the present invention, the guard ring is connected to a bias voltage source.

Accordingly, the present invention provides a high-side field effect transistor for improved high-side ability to be tolerant higher voltage and in order to have better performance.

BRIEF DESCRIPTION OF THE DRAWINGS

The present invention will become more readily apparent to those ordinarily skilled in the art after reviewing the following detailed description and accompanying drawings, in which:

FIG. 1b is a top plan view according the high-side field effect transistor of FIG. 1a.

FIG. 2b is a top plan view according the high-side field effect transistor of FIG. 2a;

DETAILED DESCRIPTION OF PREFERRED EMBODIMENTS

The present invention is described more specifically with reference to the following embodiments. It is to be noted that the following descriptions of preferred embodiments of this invention are presented herein for purpose of illustration and description only but not intended to be exhaustive or to be limited to the precise form disclosed.

Figure 1A:
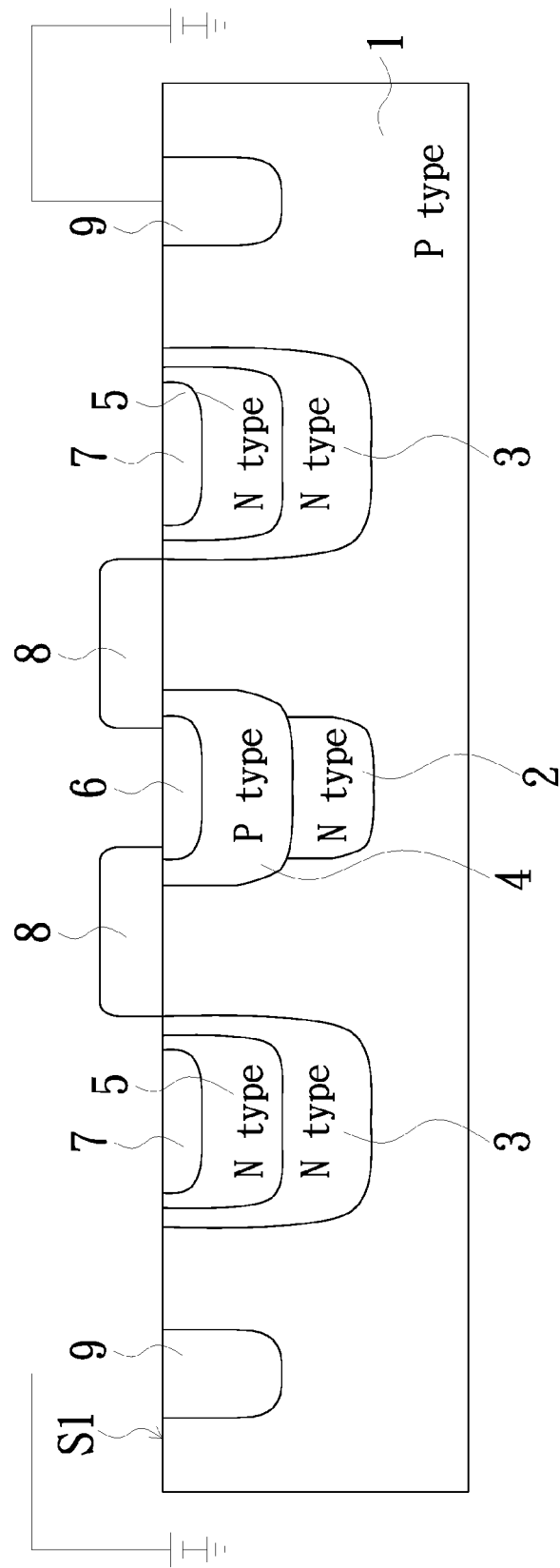
FIG. 1a is a cross-sectioned structural diagram with only main features of a high-side field effect transistor according to the present invention being shown.
Figure 1B:
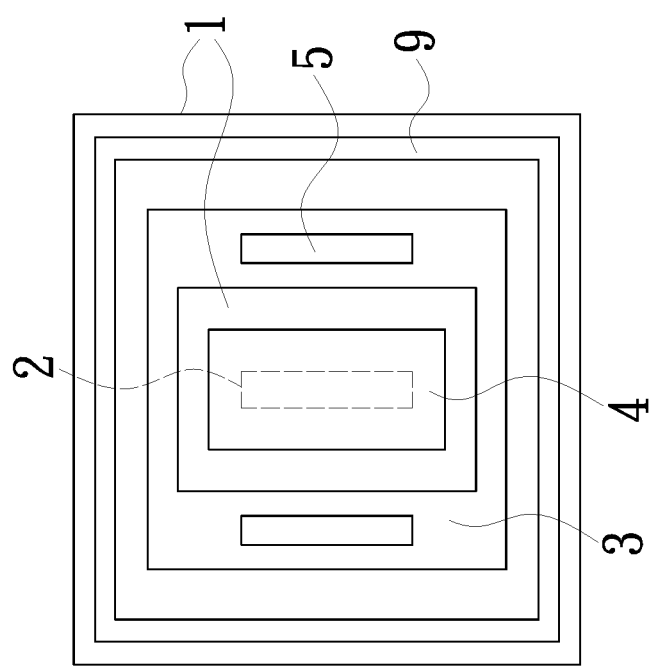

The present invention provides a high-side field effect transistor for better high-side ability to be tolerant higher voltage and in order to provide a high-side field effect transistor with better performance. FIG. 1a is a cross-sectional structural diagram with only main features of a high-side field effect transistor according to the present invention being shown, and FIG. 1b is a top plan view according to the high-side field effect transistor of FIG. 1a. FIGS. 1a and 1b are to illustrate the spirit of the present invention but not to limit the scope of present invention.

As shown in FIGS. 1a and 1b, the high-side field effect transistor comprises a substrate 1 having a surface S1, a first deep well region 2, a second deep well region 3, a first well region 4, two second well regions 5, a source region 6, two drain regions 7, two gate structures 8, and a guard ring 9. Again, FIGS. 1a and 1b shows only main features of the present invention for illustration. In order to facilitate description, features, such as spacers, salicide layers, dielectric layers, isolations, and contact regions, can be arranged by different cases and needs, and are therefore not further described herein.

The first deep well region 2 is disposed in the substrate 1, and the second deep well region 3 is disposed also in the substrate 1 but isolated from and encircling the first deep well region 2. As shown in FIG. 1b, the first deep well region 2 is encircled by the second deep well region 3, wherein the second deep well region 3 seals the first deep well region 2 as a ring shape or structure. The first deep well region 2 and the second deep well region 3 have a same first doping type with a concentration in a range of $1 \times 10^{15} \sim 1 \times 10^{16}$ dopant atoms per $cm^3$. The first well region 4 is disposed in the substrate 1 and on the first deep well region 2. As shown in FIGS. 1a and 1b, the first well region 4 covers the first deep well region 2 with a width of the first well region 4 larger than a width of the first deep well region 2 by 3-4 times. Wherein the first well region 4 has a second doping type different from the first doping type with a doping concentration in a range of $1 \times 10^{17} \sim 1 \times 10^{18}$ dopant atoms per $cm^3$. The first well region 4 is also isolated from and encircled by the second deep well region 3, as shown in FIG. 1b. The second well regions 5 are disposed in the second deep well region 3, and on two opposite sides of the second deep well region 3. The second well regions 5 are respectively at two opposite sides of the first well region 4, as shown in FIGS. 1a and 1b. The depth of the first well region 4 is about the same depth of the second well region 5 from the surface S1, wherein the first well region 4 and second well region 5 are isolated to each other by a distance in a range of 1-10 um. Wherein the second well regions 5 have the first doping type with a higher doping concentration than the second deep well region 3, and a width of the second deep well region 3 is larger than a width of the second well region 5 from the top view as shown in FIG. 1b by 3-4 times. The doping concentration of the second well regions 5 is in a range of $1 \times 10^{17} \sim 1 \times 10^{18}$ dopant atoms per $cm^3$. The source region 6 is disposed in the first well region 4 and adjacent to the surface S1 of the substrate 1, and the two drain regions 7 are disposed in the second well regions 5 respectively, adjacent to the surface S1 of the substrate 1, and at two opposite sides of the source region 6 respectively. The source and drain regions 6 and 7 have the same first doping type. And doping concentrations of the source region 6 and the drain regions 7 are higher than the doping concentration of the first and second well regions 4 and 5, respectively, and in a range of $1 \times 10^{19} \sim 1 \times 10^{20}$ dopant atoms per $cm^3$. The two gate structures 8 are disposed on the surface S1 of the substrate 1, and each of the two gate structures 8 is disposed between the source region 6 and one of the two drain regions 7, respectively. The guard ring 9 is disposed in the substrate 1 and encircling the second deep well region 3. As shown in FIG. 1b particularly, the guard ring 9 is sealed as a ring shape enclosing the second deep well region 3 and other features, such as the first deep well region 2, the first and second well region 4 and 5, the drain regions 7, the source region 6 and the gate structures 8, in-between.

The central source structure (the source region 6 with the two drain regions 7 on the sides) as illustrated above can prevent the problem of electric field punching through because the source region is protected at center of the substrate and away from peripheral region of the transistor, and thus improve high-side ability of the effect transistor. Moreover, a central deep well region isolated from and encircled by an outer ring-shaped deep well region (the first deep well region 2 isolated from and encircled by the second deep well region 3) can provide better voltage tolerance due to extra-low doping concentration between the two deep well regions (the first and second deep well regions 2 and 3) and thus enhance voltage tolerance of the substrate (the substrate 1). Therefore, the present invention can provide a transistor working as a high-side switching configuration with improved high-side ability and solved the problem of limited performance due to structure of a conventional high-side switching configuration.

Figure 2A:
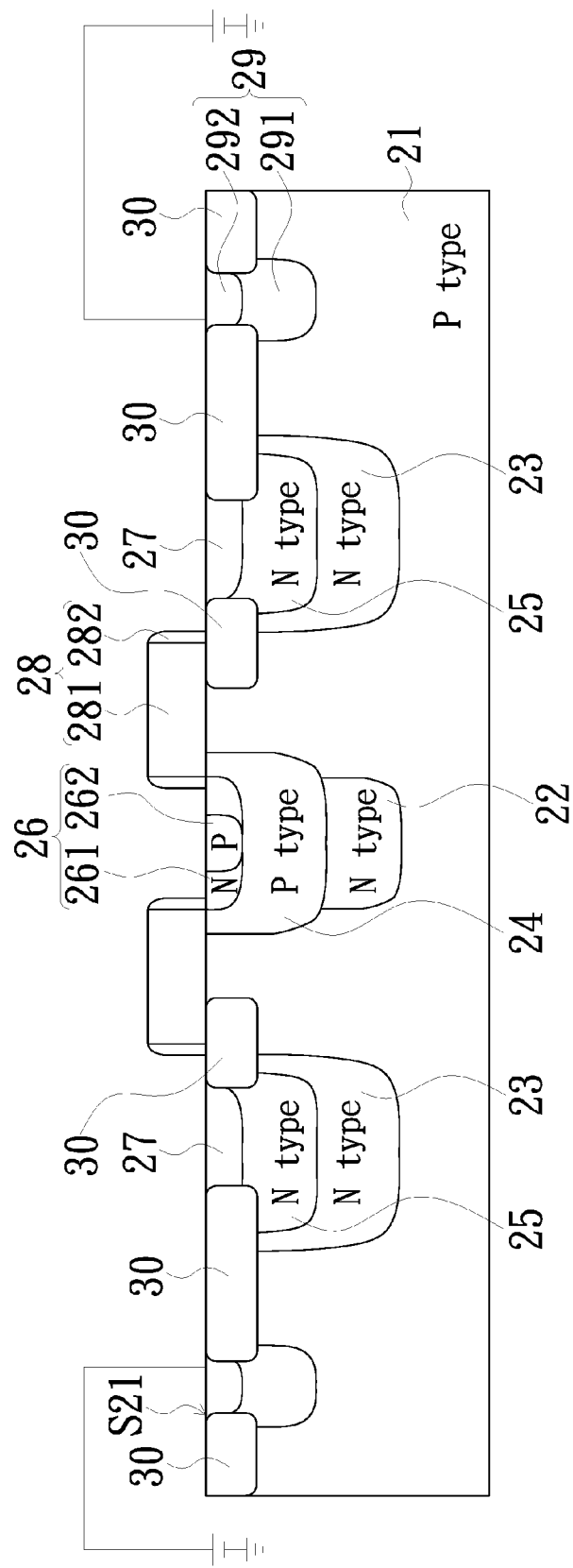
FIG. 2a is a cross-sectioned structural diagram of a high-side field effect transistor according to an embodiment of the present invention.
Figure 2B:
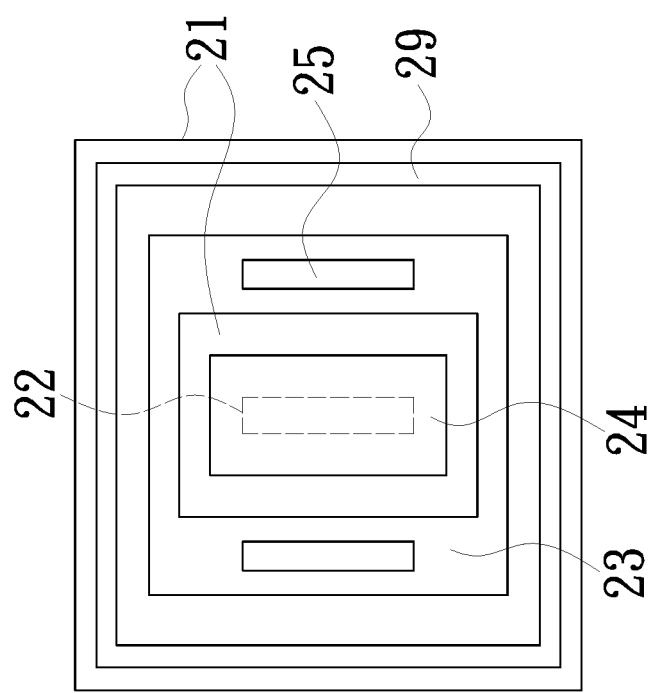

FIG. 2a is a cross-sectional structural diagram of a high-side field effect transistor according to an embodiment of the present invention, and FIG. 2b is a top plan view according to the high-side field effect transistor of FIG. 2a. The high-side field effect transistor according to the embodiment shown in FIGS. 2a and 2b comprises a substrate 21 having a surface S21, a first deep well region 22, a second deep well region 23, a first well region 24, two second well regions 25, a source region 26 comprising a doped source region 261 and a source contact region 262, two drain regions 27, two gate structures 28 comprising two gate electrodes 281 and two pairs of spacers 282, a guard ring 29 comprising a guard ring region 291 and a guard ring contact region 292, and a plurality of isolations 30.

The disposition arrangement and relative distribution of main features including, the substrate 21, the first deep well region 22, the second deep well region 23, the first well region 24, the two second well regions 25, the source region 26, the two drain regions 27, the two gate structures 28, and the guard ring 29, are similar to the above illustrated embodiment as shown in FIGS. 1a and 1b, however, more detailed features are described in the embodiment of FIGS. 2a and 2b.

In this embodiment, each of the gate structures 28 at least comprises the gate electrode 281 and a pair of the spacers 282, wherein the spacers 282 can be disposed on the source region 26 and adjacent to two sides of the gate electrode 281. The source region 26 comprises the doped source region 261 on the peripheral of the source region 26 and the source contact region 262 disposed at about center (portion) of the source region 26 between the spacers 282, wherein the source contact region 262 has the second doping type. The guard ring 29 comprises the guard ring region 291 and the guard ring contact region 292, wherein the guard ring region 291 and the guard ring contact region 292 both have the same second doping type. A doping concentration of the guard ring contact region 292 is higher than a doping concentration of the guard ring region 291. And the plurality of isolations 30 are all disposed in the substrate 21 adjacent to the surface S21, wherein the isolations 30 are disposed respectively on periphery of the substrate 21, between the guard ring 29 and the drain region 27, and between the gate structure 28 and the drain region 27 with a portion thereof covered by the gate structure 28. The isolations 30 can be shallow trench isolations, and each of the isolations 30 has a width in a range of 1-15 um and a depth from the surface S1 in a range of 3000-6000 angstroms (Å).

In this embodiment, the substrate 21 is doped with P type, and the first doping type is N type and the second doping type is P type.

From the illustration above, it should be understood that field effect transistors provided by the present invention can solve the problem of electric field punching through and have improved high-side ability and better voltage tolerance of substrate theoretically. The inventor has also done a couple of tests to show field effect transistors provided by the present invention practically has improved high-side ability than conventional field effect transistors.

To test the high-side ability, a voltage difference of 60 V between a substrate and a drain region is provided to create a high-side condition. For easier understanding, the embodiment shown in FIG. 2a-2b of the present invention is used during the test, and it is for illustration only but not limited the present invention to a certain embodiment.

Figure 3A:
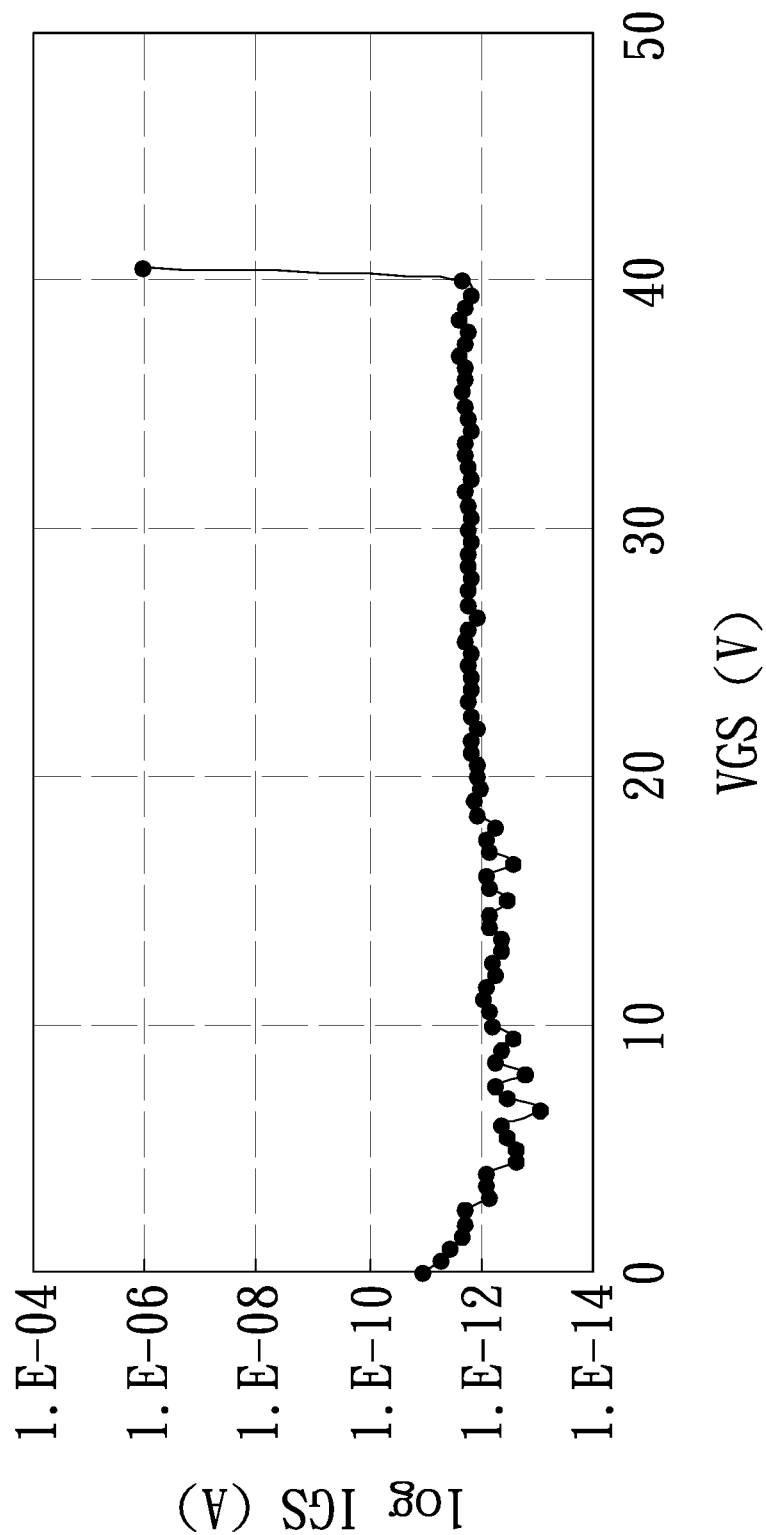
FIG. 3a is a sweep voltage waveform diagram according to a test performed to the embodiment shown in FIG. 2a-2b.
Figure 3B:
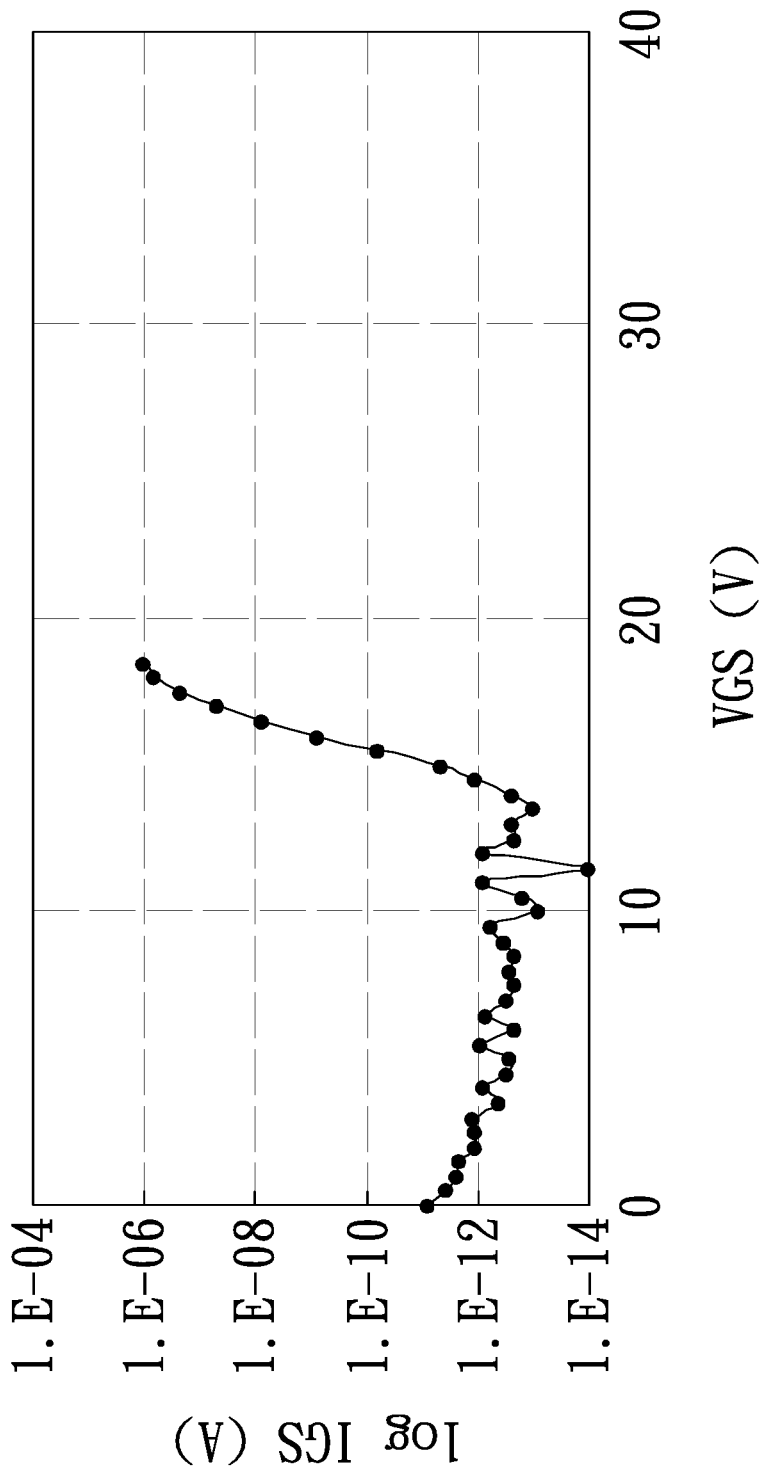
FIG. 3b is a sweep voltage waveform diagram according to a test performed to a conventional high-side field effect transistor.

The guard ring 29 is connected to a bias voltage source via the guard ring contact region 292. In the test, the bias voltage source provides a voltage of −20 V to the substrate, and a voltage of 40 V is provided to the drain region 27 in order to have a voltage difference of 60 V. Then a sweep voltage is provided across the gate structure 28 and the source region 26. FIG. 3a is a sweep voltage waveform diagram according to results obtained from a test conducted according to the embodiment of present invention, and FIG. 3b is a sweep voltage waveform diagram according to results obtained from a test conducted using a conventional high-side field effect transistor. In FIGS. 3a-3b, X-axis (horizontal axis) is voltage (V), and Y-axis (vertical axis) is ampere (A) in logarithmic scale.

As shown in FIG. 3a, the transistor according to the embodiment of present invention can function very stably with a sweep voltage applied equal to or below 40 V. However, if the same high-side condition is applied to the conventional high-side field effect transistor as shown in FIG. 3b, the transistor cannot function stably under condition of a voltage difference of 60 V and falls off when applying a sweep voltage about 15 V.

In accordance with the aforementioned illustration and embodiments of the present invention, the present invention provides a high-side field effect transistor for better high-side ability to be tolerant of higher voltage and in order to provide a high-side field effect transistor with better performance and high-side ability. The high-side field effect transistor cannot only solve problems easily happened or occurred in a conventional high-side field effect transistor but also can reduce at least a photolithography step when compared against a manufacturing method of a conventional high-side field effect transistor.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A high-side field effect transistor, comprising:
   a substrate having a surface;
   a first deep well region disposed in the substrate;
   a second deep well region disposed in the substrate, separated from the first deep well region by a portion of the substrate and encircling the same;
   a first well region disposed in the substrate and on the first deep well region;
   two second well regions disposed in the second deep well region and respectively at two opposite sides of the first well region;
   a source region disposed in the first well region and adjacent to the surface of the substrate;
   two drain regions disposed in the two second well regions respectively and adjacent to the surface of the substrate;
   two gate structures disposed on the surface of the substrate, wherein each of the two gate structures is disposed between the source region and one of the drain regions respectively; and
   a guard ring disposed in the substrate encircling the second deep well region, and on the periphery of the high-side field effect transistor, wherein
   the substrate has a different conductive type from a conductive type of the first and second deep well regions, and the conductive type of the substrate is P type.

2. The high-side field effect transistor according to claim 1, wherein the source region comprises a source contact region with a conductive type different from a conductive type of the source region.

3. The high-side field effect transistor according to claim 1, wherein the first and second deep well regions have the same conductive type.

4. The high-side field effect transistor according to claim 1, wherein the first and second well regions have different conductive types.

5. The high-side field effect transistor according to claim 1, further comprising:
   a plurality of isolations disposed between one of the gate structures and one of the drain regions and between one of the drain regions and the guard ring.

6. The high-side field effect transistor according to claim 1, wherein a doping concentration of the first well region is higher than a doping concentration of the first deep well region.

7. The high-side field effect transistor according to claim 1, wherein doping concentrations of the two second well regions are higher than a doping concentration of the second deep well region.

8. The high-side field effect transistor according to claim 1, wherein a doping concentration of the source region is higher than a doping concentration of the first well region.

9. The high-side field effect transistor according to claim 1, wherein doping concentrations of the drain regions are higher than doping concentrations of the two second well regions.

10. The high-side field effect transistor according to claim 1, wherein a width of the first well region is larger than a width of the first deep well region.

11. The high-side field effect transistor according to claim 1, wherein widths of the two second well regions are smaller than a width of the second deep well region.

12. The high-side field effect transistor according to claim 1, wherein the guard ring comprises:
    a guard ring region having a same conductive type as the first well region; and a guard ring contact region disposed adjacent to the surface of the substrate.

13. The high-side field effect transistor according to claim 1, wherein the conductive type of the first and second deep well regions is N type.

14. The high-side field effect transistor according to claim 1, wherein the guard ring is connected to a bias voltage source.

15. A high-side field effect transistor, comprising:
a substrate having a surface;
a first deep well region disposed in the substrate;
a second deep well region disposed in the substrate, separated from and encircling the first deep well region;
a first well region disposed in the substrate and on the first deep well region;
two second well regions disposed in the second deep well region and respectively at two opposite sides of the first well region;
a source region disposed in the first well region and adjacent to the surface of the substrate;
two drain regions disposed in the two second well regions respectively and adjacent to the surface of the substrate;
two gate structures disposed on the surface of the substrate, wherein each of the two gate structures is disposed between the source region and one of the drain regions respectively; and
a guard ring disposed in the substrate encircling the second deep well region, and on the periphery of the high-side field effect transistor, wherein
the substrate has a different conductive type from a conductive type of the first and second deep well regions, and the conductive type of the substrate is P type, and wherein a portion of the substrate is disposed in between the second deep well region and the first deep well region under a top plan view.

* * * * *